(12) United States Patent
Brauchler

(10) Patent No.: US 7,109,812 B2
(45) Date of Patent: Sep. 19, 2006

(54) APPARATUS AND METHOD FOR PRESENTING A LINEAR CAPACITIVE OUTPUT IN RESPONSE TO A VOLTAGE INPUT

(75) Inventor: Fred T. Brauchler, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 77 days.

(21) Appl. No.: 10/785,687

(22) Filed: Feb. 24, 2004

(65) Prior Publication Data

US 2005/0185426 A1 Aug. 25, 2005

(51) Int. Cl.
*H03B 5/12* (2006.01)

(52) U.S. Cl. .............................. 331/117 FE; 331/179; 331/177 V; 307/109

(58) Field of Classification Search ................ 307/246, 307/264, 475, 350, 108–110; 323/281, 282; 331/117 R, 179, 177 R, 177 V; 327/111, 327/108; 363/16, 17, 19
See application file for complete search history.

*Primary Examiner*—Rajnikant B. Patel
(74) *Attorney, Agent, or Firm*—Frederick J. Telecky, Jr.; W. James Brady, III

(57) ABSTRACT

An apparatus for presenting a substantially linear capacitive output at at least one output locus in response to a voltage input at an input locus, the voltage input varying over a voltage range, includes a plurality of switching units coupled with the input locus. Each respective switching unit of the plurality of switching units is coupled with one output locus of the at least one output locus. Each respective switching unit presents a contributing capacitive output at the one output locus. The contributing capacitive output exhibits a generally linear response to the voltage input over a segment of the voltage range. All the respective switching units cooperate to establish the substantially linear capacitive output over substantially all of the voltage range.

16 Claims, 4 Drawing Sheets

400

APPARATUS AND METHOD FOR PRESENTING A LINEAR CAPACITIVE OUTPUT IN RESPONSE TO A VOLTAGE INPUT

BACKGROUND OF THE INVENTION

The present invention is directed to voltage dependent capacitance circuits, commonly known as varactors, and especially to voltage dependent capacitance circuits that exhibit substantially linear capacitance variance over a voltage range. In its preferred embodiment, the voltage dependent capacitance circuit of the present invention is implemented using metal oxide silicon (MOS) technology.

Nearly all radio frequency (RF) or other analog systems require a phase locked loop (PLL). A PLL is a somewhat complicated device that requires a control element almost always embodied in a type of voltage dependent capacitance device, or varactor, to control the frequency of a VCO (voltage controlled oscillator). Various fabrication technologies may be employed to produce the necessary VCO, including by way of example and not by way of limitation, Schottky diodes and CMOS (complementary metal oxide silicon) processes that include using MOS technology.

Schottky diodes have non-linear capacitance characterisitics. They are commonly used in designing VCO devices, but are not available in CMOS processes. For that reason when one employs CMOS processes an MOS varactor must be employed. An MOS varactor exhibits an even more non-linear voltage-to-capacitance characteristic than a Schottky diode. As a result, a VCO produced using CMOS processes exhibits a very non-linear voltage-to-frequency change. As a consequence, a control system (e.g., a PLL) using a VCO implemented using CMOS processes requires a significant phase margin to allow for variation from linearity in response by the VCO to variations in voltage.

A varactor implemented using CMOS processes (hereinafter referred to as an MOS varactor) may have to be restricted to a small or narrow range of capacitance output to approximate an acceptably linear response to voltage variations.

Another important consideration is that MOS varactors are sensitive to process variations in their manufacture, such as temperature variations, material variations and other processing variations.

There is a need for a varactor apparatus and method that permit substantially linear capacitive response over a relatively wide range of voltage input variation.

In particular there is a need for a varactor apparatus that is manufactured using CMOS processes and permits substantially linear capacitive response over a relatively wide range of voltage input variation.

SUMMARY OF THE INVENTION

An apparatus for presenting a substantially linear capacitive output at at least one output locus in response to a voltage input at an input locus, the voltage input varying over a voltage range, includes a plurality of switching units coupled with the input locus. Each respective switching unit of the plurality of switching units is coupled with one output locus of the at least one output locus. Each respective switching unit presents a contributing capacitive output at the one output locus. The contributing capacitive output exhibits a generally linear response to the voltage input over a segment of the voltage range. All the respective switching units cooperate to establish the substantially linear capacitive output over substantially all of the voltage range.

A method for presenting a substantially linear capacitive output at at least one output locus in response to a voltage input at an input locus, the voltage input varying over a voltage range, includes the steps of: (a) providing a plurality of switching units coupled with the input locus; (b) coupling each respective switching unit of the plurality of switching units with one output locus of the at least one output locus; each respective switching unit presenting a contributing capacitive output at the one output locus; each respective contributing capacitive output exhibiting a generally linear response to the voltage input over a segment of the voltage range; and (c) varying the voltage input over the voltage range so that the plurality of switching units cooperates to establish the substantially linear capacitive output over substantially all of the voltage range.

It is, therefore, an object of the present invention to provide an apparatus and method that permit substantially linear capacitive response over a relatively wide range of voltage input variation.

It is a further object of the present invention to provide a varactor apparatus that is manufactured using CMOS processes and permits substantially linear capacitive response over a relatively wide range of voltage input variation.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
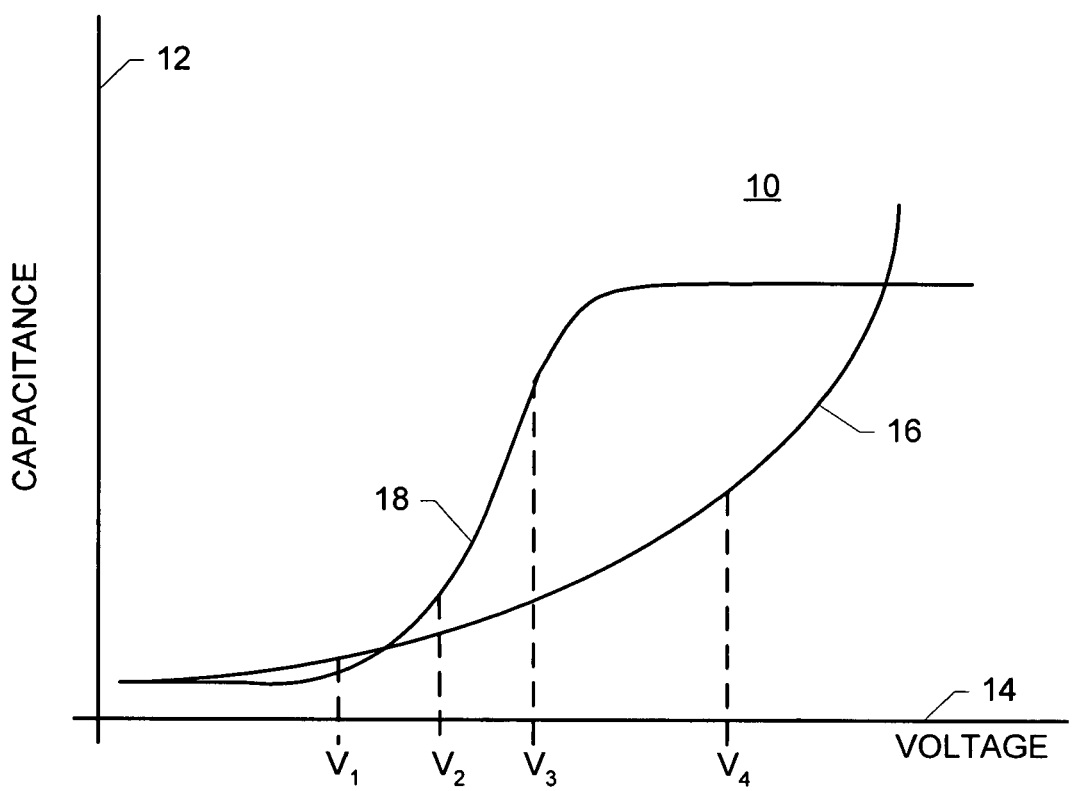
FIG. 1 is a graphic illustration of variance of capacitive output as a function of voltage for two representative devices.

FIG. 1 is a graphic illustration of variance of capacitive output as a function of voltage for two representative devices. In FIG. 1, a graphic plot 10 includes a vertical axis 12 representing capacitance and a horizontal axis 14 representing voltage. A curve 16 represents capacitive output from a Schottky diode as a voltage input is varied. One may discern by inspection that curve 16 is not linear. As a practical matter designers may use a portion of curve 16 for a given Schottky diode, for example between voltages $V_1$, $V_4$, to approximate a linear capacitive response.

A curve 18 represents capacitive output from an MOS varactor as a voltage input is varied. One may discern by inspection that curve 18 is not linear. Curve 18 deviates from linearity to an even greater extent than is experienced by curve 16. However, as a practical matter designers may use a portion of curve 18 for a given MOS varactor, for example between voltages $V_2$, $V_3$, to approximate a linear capacitive response. Linearity of capacitive response may be approximated in an MOS varactor, as may be observed by the response of curve 18 between voltages $V_2$, $V_3$. However, the linear-approximating voltage range $V_2$ to $V_3$ of curve 18 is narrower than the linear-approximating voltage range $V_1$ to $V_4$ of curve 16. That is, the range of linearity for an MOS varactor is more limited, or narrower, than the range of linearity for a Schottky diode and is therefore of limited utility in circuit design.

Figure 2:
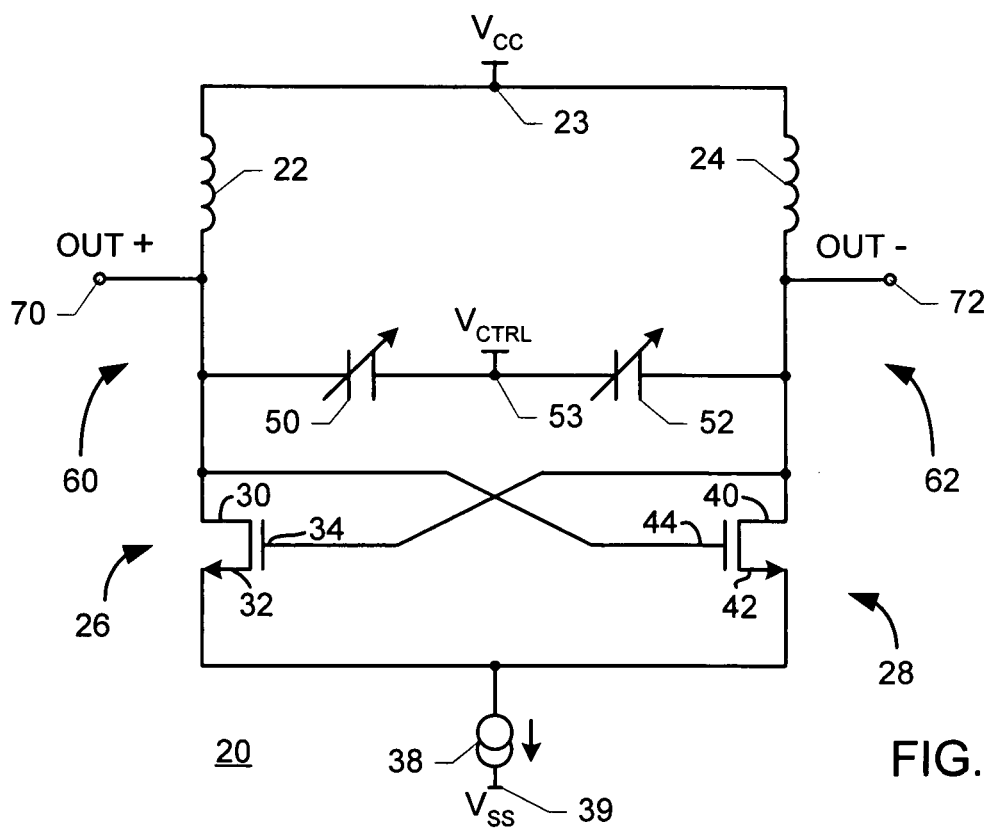
FIG. 2 is an electrical schematic diagram of an exemplary device that uses a variable capacitive unit.

FIG. 2 is an electrical schematic diagram of an exemplary device that uses a variable capacitive unit. In FIG. 2, a voltage controlled oscillator (VCO) 20 includes inductors 22, 24 coupled with a supply voltage $V_{CC}$ at a voltage supply locus 23 and with metal oxide silicon (MOS) transistors 26, 28. MOS transistor 26 has a drain 30, a source 32 and a gate 34. MOS transistor 28 has a drain 40, a source 42 and a gate 44. MOS transistor 26 drain 30 is coupled with inductor 22 and source 32 is coupled with a current source 38. Current source 38 is coupled with a lower rail supply voltage $V_{SS}$ at a voltage supply locus 39. MOS transistor 28 drain 40 is coupled with inductor 24 and source 42 coupled with current source 38. MOS transistor gate 34 is coupled with drain 40. MOS transistor 28 gate 44 is coupled with drain 30. A variable capacitor 50 is coupled between inductor 22 and drain 30. A variable capacitor 52 is coupled between inductor 24 and drain 40. Variable capacitors 50, 52 are controlled by a control voltage $V_{CTRL}$ provided at a control locus 53. Output signals are presented at output loci 70, 72.

VCO 20 is thus comprised of a first inductance-capacitance (LC) resonator circuit 60 that includes inductor 22 and capacitor 50, and a second LC resonator circuit 62 that includes inductor 22 and capacitor 52. Control voltage $V_{CTRL}$ varies capacitive output of variable capacitors 50, 52 and thereby effectively operates to tune VCO 20.

Figure 3:
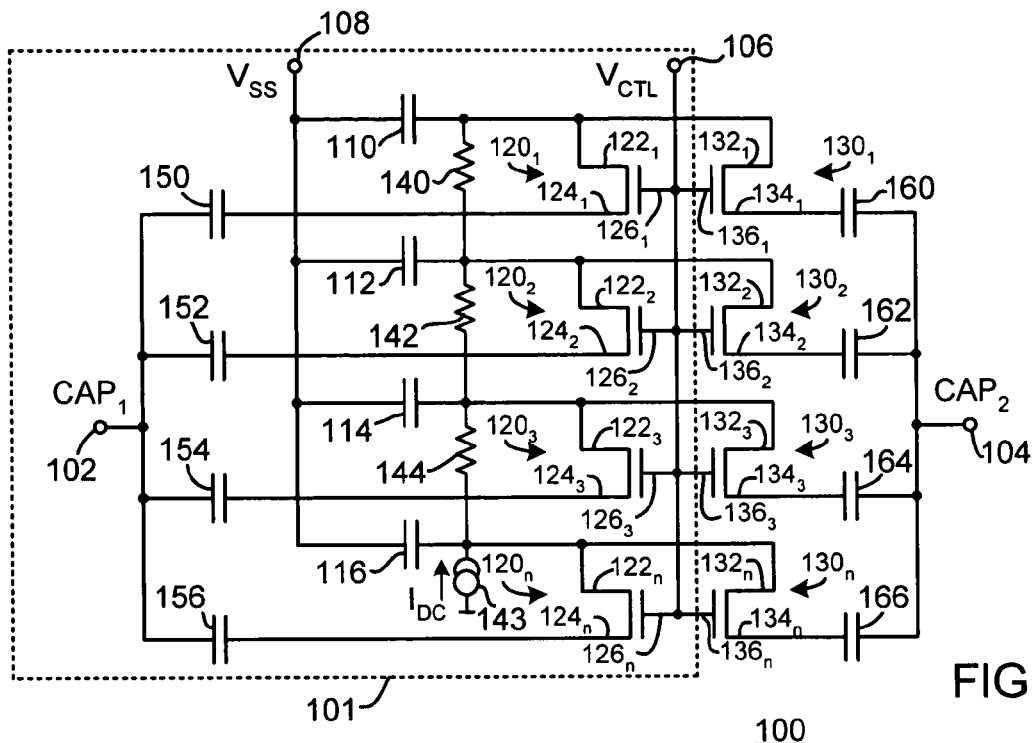
FIG. 3 is an electrical schematic diagram of the preferred embodiment of the apparatus of the present invention.

FIG. 3 is an electrical schematic diagram of the preferred embodiment of the apparatus of the present invention. In FIG. 3, an apparatus 100 for presenting a linear capacitive output in response to a voltage input is configured for differential provision of capacitive outputs $CAP_1$, $CAP_2$ at output loci 102, 104 in response to a voltage input $V_{CTL}$ applied at an input locus 106. Apparatus 100 includes a plurality of metal oxide silicon (MOS) transistors $120_1$, $120_2$, $120_3$, $120_n$ for participation in providing capacitive output $CAP_1$ and includes a plurality of MOS transistors $130_1$, $130_2$, $130_3$, $130_n$ for participation in providing capacitive output $CAP_2$. The indicator "n" is employed to signify that there can be any number of MOS transistors $120_n$, $130_n$ in apparatus 100. The inclusion of four MOS transistors $120_n$, $130_n$ in apparatus 100 in FIG. 3 is illustrative only and does not constitute any limitation regarding the number of MOS transistors that may be included in the apparatus of the present invention.

Each of transistors $120_n$, $130_n$ has a source, a drain and a gate. Transistor $120_1$ has a source $122_1$, a drain $124_1$ and a gate $126_1$. Transistor $120_2$ has a source $122_2$, a drain $124_2$ and a gate $126_2$. Transistor $120_3$ has a source $122_3$, a drain $124_3$ and a gate $126_3$. Transistor $120_n$ has a source $122_n$, a drain $124_n$ and a gate $126_n$. Transistor $130_1$ has a source $132_1$, a drain $134_1$ and a gate $136_1$. Transistor $130_2$ has a source $132_2$, a drain $134_2$ and a gate $136_2$. Transistor $130_3$ has a source $132_3$, a drain $134_3$ and a gate $136_3$. Transistor $130_n$ has a source $132_n$, a drain $134_n$ and a gate $136_n$.

Input locus 106 is coupled with all gates $126_n$, $136_n$ (i.e., connected with gates $126_1$, $126_2$, $126_3$, $126_n$, $136_1$, $136_2$, $136_3$, $136_n$). Sources $122_1$, $132_1$ are coupled with a supply voltage $V_{SS}$ at a supply voltage locus 108 via a capacitor 110. Sources $122_2$, $132_2$ are coupled with supply voltage $V_{SS}$ at supply voltage locus 108 via a capacitor 112. Sources $122_3$, $132_3$ are coupled with supply voltage $V_{SS}$ at supply voltage locus 108 via a capacitor 114. Sources $122_n$, $132_n$ are coupled with supply voltage $V_{SS}$ at supply voltage locus 108 via a capacitor 116. Capacitors 110, 112, 114, 116 are generally large capacitors (as compared with other capacitors in apparatus 100) so that capacitors 110, 112, 114, 116 effectively ground AC (alternating current) signals between MOS transistors $120_n$, $130_n$ and supply voltage input locus 108.

A resistor 140 is coupled between source $122_1$ and source $122_2$. A resistor 142 is coupled between source $122_2$ and source $122_3$. A resistor 144 is coupled between source $122_3$ and source $122_n$. A direct current (DC) current source 143 is coupled to establish a current flow through resistors 140, 142, 144 and thereby establish desired voltage potentials across resistors 140, 142, 144. Resistors 140, 142, 144 cooperate with current source 143 to establish increased potentials at respective sources $122_1$, $122_2$, $122_3$, $122_n$. That is, potential at source $122_2$ is greater than potential at source $122_1$ by the amount of potential drop across resistor 140. Potential at source $122_3$ is greater than potential at source $122_2$ by the amount of potential drop across resistor 142. Potential at source $122_n$ is greater than potential at source $122_3$ by the amount of potential drop across resistor 144. In such manner, increased source-to-gate potential is established for each of respective MOS transistors $120_1$, $120_2$, $120_3$, $120_n$. When a sufficient level of control voltage $V_{CTL}$ is applied to input locus 106 to turn on transistor $120_1$, transistor $120_1$ becomes conductive so that a capacitor 150 is enabled and contributes to capacitive output presented at output locus 102. A level of control voltage $V_{CTL}$ sufficient to turn on transistor $120_2$ is greater than the level of control voltage $V_{CTL}$ sufficient to turn on transistor $120_1$ because of the increased source-to-gate potential established by resistor 140. Enabling of a capacitor 152 so that it may contribute to capacitive output at output locus 102 begins at a higher control voltage $V_{CTL}$ than is required for enabling capacitor 150. A level of control voltage $V_{CTL}$ sufficient to turn on transistor $120_3$ is greater than the level of control voltage $V_{CTL}$ sufficient to turn on transistor $120_2$ because of the increased source-to-gate potential established by resistor 142. Enabling of a capacitor 154 so that it may contribute to capacitive output at output locus 102 begins at a higher control voltage $V_{CTL}$ than is required for enabling capacitor 152. A level of control voltage $V_{CTL}$ sufficient to turn on transistor $120_n$ is greater than the level of control voltage $V_{CTL}$ sufficient to turn on transistor $120_3$ because of the increased source-to-gate potential established by resistor 144. Enabling of a capacitor 156 so that it may contribute to capacitive output at output locus 102 begins at a higher control voltage $V_{CTL}$ than is required for enabling capacitor 154.

Resistor 140 is also coupled between source $132_1$ and source $132_2$ because source $122_1$ is in common with source $132_1$. Resistor 142 is also coupled between source $132_2$ and source $132_3$ because source $122_2$ is in common with source $132_2$. Resistor 144 is coupled between source $132_3$ and source $132_n$ because source $122_3$ is in common with source $132_3$. Resistors 140, 142, 144 cooperate with current source 143 to establish increased potentials at respective sources $132_1$, $132_2$, $132_3$, $132_n$. That is, potential at source $132_2$ is greater than potential at source $132_1$ by the amount of potential drop across resistor 140. Potential at source $132_3$ is greater than potential at source $132_2$ by the amount of potential drop across resistor 142. Potential at source $132_n$ is greater than potential at source $132_n$ by the amount of potential drop across resistor 144. In such manner, increased source-to-gate potential is established for each of respective MOS transistors $130_1$, $130_2$, $130_3$, $130_n$. When a sufficient level of control voltage $V_{CTL}$ is applied to input locus 106 to turn on transistor $130_1$, transistor $130_1$ becomes conductive so that a capacitor 160 is enabled and contributes to capacitive output presented at output locus 104. A level of control voltage $V_{CTL}$ sufficient to turn on transistor $130_2$ is greater than the level of control voltage $V_{CTL}$ sufficient to turn on transistor $130_1$ because of the increased source-to-gate potential established by resistor 140. Enabling of a capacitor 162 so that it may contribute to capacitive output at output locus 104 begins at a higher control voltage $V_{CTL}$ than is required for enabling capacitor 160. A level of control voltage $V_{CTL}$ sufficient to turn on transistor $130_3$ is greater than the level of control voltage $V_{CTL}$ sufficient to turn on transistor $130_2$ because of the increased source-to-gate potential established by resistor 142. Enabling of a capacitor 164 so that it may contribute to capacitive output at output locus 104 begins at a higher control voltage $V_{CTL}$ than is required for enabling capacitor 162. A level of control voltage $V_{CTL}$ sufficient to turn on transistor $130_n$ is greater than the level of control voltage $V_{CTL}$ sufficient to turn on transistor $130_3$ because of the increased source-to-gate potential established by resistor 144. Enabling of a capacitor 166 so that it may contribute to capacitive output at output locus 104 begins at a higher control voltage $V_{CTL}$ than is required for enabling capacitor 164.

Transistor $120_1$ and capacitor 150 may be embodied in a switching unit responsive to control voltage $V_{CTL}$ for contributing capacitance to output locus 102. Transistor $120_2$ and capacitor 152 may be embodied in a switching unit responsive to control voltage $V_{CTL}$ for contributing capacitance to output locus 102. Transistor $120_3$ and capacitor 154 may be embodied in a switching unit responsive to control voltage $V_{CTL}$ for contributing capacitance to output locus 102. Transistor $120_n$ and capacitor 156 may be embodied in a switching unit responsive to control voltage $V_{CTL}$ for contributing capacitance to output locus 102.

Transistor 130, and capacitor 160 may be embodied in a switching unit responsive to control voltage $V_{CTL}$ for contributing capacitance to output locus 104. Transistor $130_2$ and capacitor 162 may be embodied in a switching unit responsive to control voltage $V_{CTL}$ for contributing capacitance to output locus 104. Transistor $130_3$ and capacitor 164 may be embodied in a switching unit responsive to control voltage $V_{CTL}$ for contributing capacitance to output locus 104. Transistor $130_n$ and capacitor 166 may be embodied in a switching unit responsive to control voltage $V_{CTL}$ for contributing capacitance to output locus 104.

As mentioned earlier, apparatus 100 is configured for differential provision of capacitance. One may use the teachings of the present invention to provide single-ended capacitance, as by using the portion of apparatus 100 enclosed within dotted line box 101.

Figure 4:
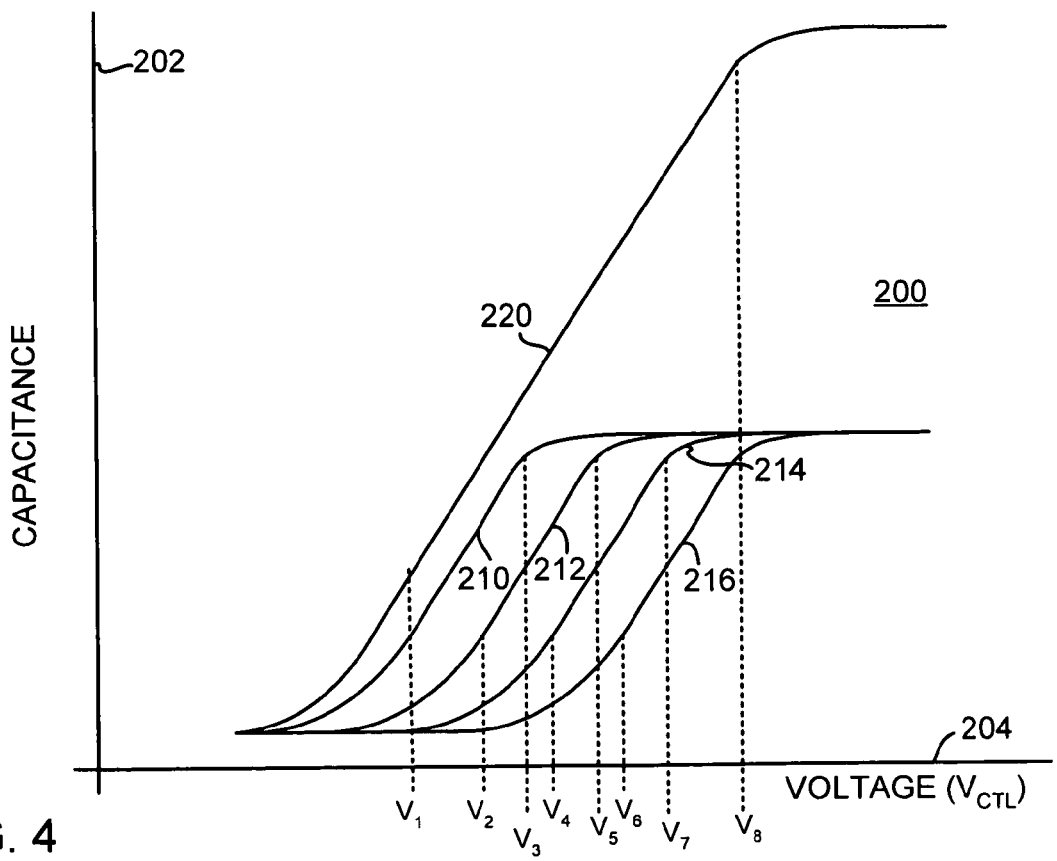
FIG. 4 is a graphic illustration of capacitive output as a function of voltage for the apparatus of the present invention.

FIG. 4 is a graphic illustration of capacitive output as a function of voltage for the apparatus of the present invention. In FIG. 4, a graphic plot 200 is presented with respect to a vertical axis 202 representing capacitance and a horizontal axis 202 representing a voltage, such as a control voltage $V_{CTL}$ (FIG. 3).

A first response curve 210 represents enabling of a first capacitor over a voltage range. The response of capacitance in the first capacitor as voltage is varied is substantially linear over a voltage range approximately spanning voltage $V_1$ to voltage $V_3$. Response curve 210 may be considered representative of enabling of capacitors 150, 160 (FIG. 3). A second response curve 212 represents enabling of a second capacitor over a voltage range. The response of capacitance in the second capacitor as voltage is varied is substantially linear over a voltage range approximately spanning voltage $V_2$ to voltage $V_5$. Response curve 212 may be considered representative of enabling of capacitors 152, 162 (FIG. 3). A third response curve 214 represents enabling of a third capacitor over a voltage range. The response of capacitance in the third capacitor as voltage is varied is substantially linear over a voltage range approximately spanning voltage $V_4$ to voltage $V_7$. Response curve 214 may be considered representative of enabling of capacitors 154, 164 (FIG. 3). A fourth response curve 216 represents enabling of a fourth capacitor over a voltage range. The response of capacitance in the fourth capacitor as voltage is varied is substantially linear over a voltage range approximately spanning voltage $V_6$ to voltage $V_8$. Response curve 216 may be considered representative of enabling of capacitors 156, 166 (FIG. 3).

Response curve 220 represents aggregate capacitance appearing at a common locus coupled with the four capacitors represented by response curves 210, 212, 214, 216. Response curve 220 may be considered representative of capacitance presented at an output locus 102, 104 (FIG. 3). Response curve 220 results from the aggregate effect of capacitors coupled to a common output locus (e.g., output loci 102, 104; FIG. 3). The aggregate capacitive response represented by response curve 220 as voltage is varied is substantially linear over a voltage range approximately spanning voltage $V_1$ to voltage $V_8$. By effecting enabling, for example, of respective capacitors 150, 152, 154, 156 commonly coupled with output locus 102, capacitance at output locus 102 varies linearly over a greater range than is presented by any one capacitor switching unit 150, $120_1$; 152, $120_2$; 154, $120_3$; 156, $120_n$. By effecting enabling, for example, of respective capacitor switching units 160, $130_1$; 162, $130_2$; 164, $130_3$; 166, $130_n$ commonly coupled with output locus 104, capacitance at output locus 104 varies linearly over a greater range than is presented by any one capacitor 160, 162, 164, 166.

As mentioned earlier, a MOS varactor may have to be restricted to a small or narrow range of capacitance output to approximate an acceptably linear response to voltage variations. By employing the present application as, by way of example and not by way of limitation, using apparatus 100, one may employ limited linear response ranges of a plurality of capacitive devices such as MOS capacitors in a stepwise arrangement of individual capacitors summed or aggregated at an output locus to present a substantially linear response over a greater voltage range than is available with any respective one of the individual capacitors to build a MOS varactor having a substantially linear capacitive response over a relatively wide range of voltage input variation.

Figure 5:
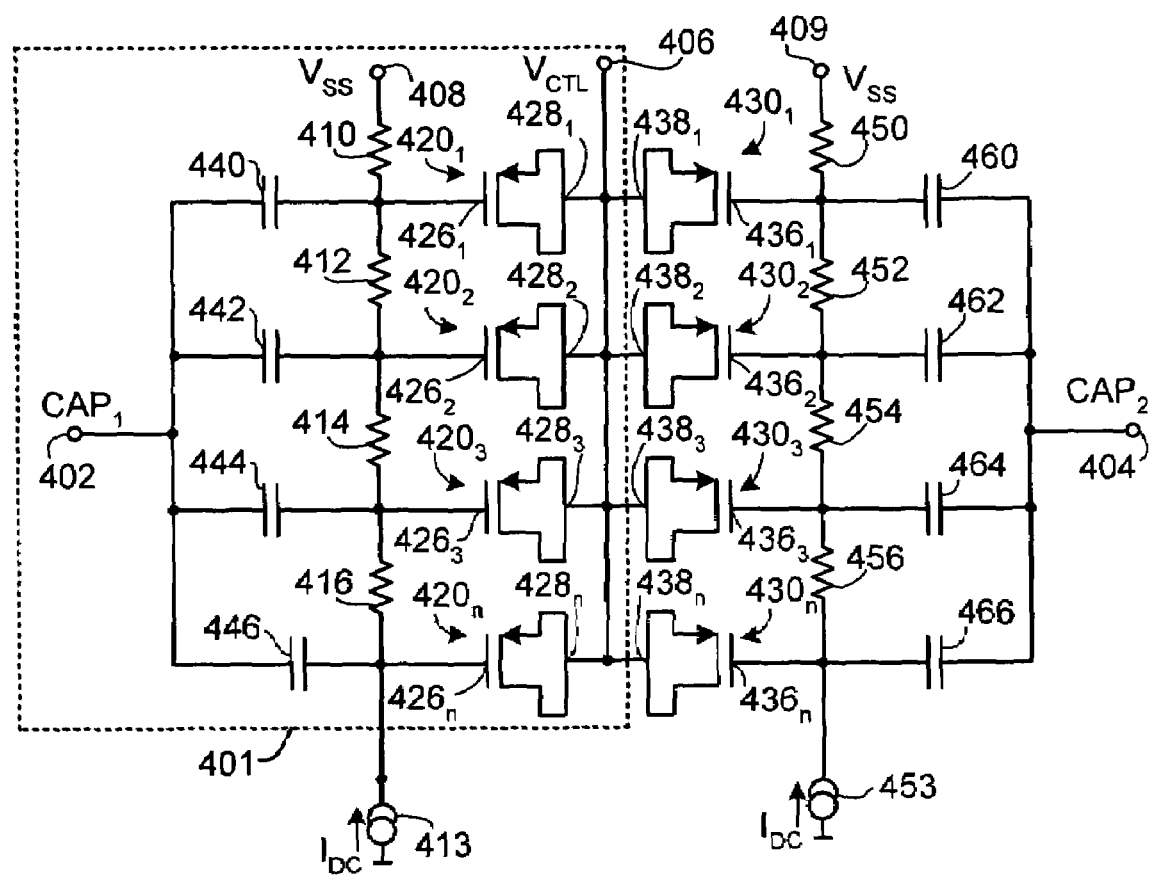
FIG. 5 is an electrical schematic diagram of an alternate embodiment of the apparatus of the present invention.

FIG. 5 is an electrical schematic diagram of an alternate embodiment of the apparatus of the present invention. In FIG. 5, an apparatus 400 for presenting a linear capacitive output in response to a voltage input is configured for differential provision of capacitive outputs $CAP_1$, $CAP_2$ at output loci 402, 404 in response to a voltage input $V_{CTL}$ applied at an input locus 406. Apparatus 400 includes a plurality of metal oxide silicon (MOS) varactors $420_1$, $420_2$, $420_3$, $420_n$ for participation in providing capacitive output $CAP_1$ and includes a plurality of MOS varactors $430_1$, $430_2$, $430_3$, $430_n$ for participation in providing capacitive output $CAP_2$. The indicator "n" is employed to signify that there can be any number of MOS varactors $420_n$, $430_n$ in apparatus 400. The inclusion of four MOS varactors $420_n$, $430_n$ in apparatus 400 in FIG. 5 is illustrative only and does not constitute any limitation regarding the number of MOS varactors that may be included in the apparatus of the present invention.

Each of varactors $420_n$, $430_n$ has a gate and a drain-source coupled in common. Varactor $420_1$ has a gate $426_1$ and a drain-source $428_1$. Varactor $420_2$ has a gate $426_2$ and a drain-source $428_2$. Varactor $420_3$ has a gate $426_3$ and a drain-source $428_3$. Varactor $120_n$ has a gate $426_n$ and a drain-source $428_n$. Varactor $430_1$ has a gate $436_1$ and a drain-source $438_1$. Varactor $430_2$ has a gate $436_2$ and a drain-source $438_2$. Varactor $430_3$ has a gate $436_3$ and a drain-source $438_3$. Varactor $430_n$ has a gate $436_n$ and a drain-source $438_n$.

Input locus 406 is coupled with all drain-sources $428_n$, $438_n$ (i.e., connected with drain-sources $428_1$, $428_2$, $428_3$, $428_n$, $438_1$, $438_2$, $438_3$, $438_n$). Gate $426_1$ is coupled with a supply voltage $V_{SS}$ at a supply voltage locus 408 via a resistor 410. Gate $426_2$ is coupled with supply voltage $V_{SS}$ at supply voltage locus 408 via resistors 410, 412. Gate $426_3$ is coupled with supply voltage $V_{SS}$ at supply voltage locus 408 via a resistors 410, 412, 414. Gate $426_n$ is coupled with supply voltage $V_{SS}$ at supply voltage locus 408 via resistors 410, 412, 414, 416. Gate $426_1$ is coupled with a capacitor 440. Gate $426_2$ is coupled with a capacitor 442. Gate $426_3$ is coupled with a capacitor 444. Gate $426_n$ is coupled with a capacitor 446.

A direct current (DC) current source 413 is coupled to establish a current flow through resistors 410, 412, 414, 416 and thereby establish desired voltage potentials across resistors 410, 412, 414, 416. Resistors 410, 412, 414, 416 cooperate with current source 413 to establish increased potentials at respective gates $426_1$, $426_2$, $426_3$, $426_n$. That is, potential at gate $426_2$ is greater than potential at gate $426_1$ by the amount of potential drop across resistor 412. Potential at gate $426_3$ is greater than potential at gate $426_2$ by the amount of potential drop across resistor 414. Potential at gate $426_n$ is greater than potential at gate $426_3$ by the amount of potential drop across resistor 416. In such manner, increased gate potential is established for each of respective MOS varactors $420_1$, $420_2$, $420_3$, $420_n$. When a sufficient level of control voltage $V_{CTL}$ is applied to input locus 406 to permit activating varactor $420_1$, varactor $420_1$ becomes more capacitive so that through capacitor 440 it contributes to the capacitive output presented at output locus 402. A level of control voltage $V_{CTL}$ sufficient to permit activating varactor $420_2$ is greater than the level of control voltage $V_{CTL}$ sufficient to permit activating varactor $420_1$ because of the increased gate potential established by resistor 412. Including a varactor $420_2$ so that it may contribute to capacitive output through capacitor 442 at output locus 402 occurs at a higher control voltage $V_{CTL}$ than is required for including varactor $420_1$. A level of control voltage $V_{CTL}$ sufficient to permit activating varactor $420_3$ is greater than the level of control voltage $V_{CTL}$ sufficient to permit activating varactor $420_2$ because of the increased gate potential established by resistor 414. Including varactor $420_3$ so that it may contribute to capacitive output through capacitor 444 at output locus 402 begins at a higher control voltage $V_{CTL}$ than is required for including varactor $420_2$. A level of control voltage $V_{CTL}$ sufficient to permit activating varactor $420_n$ is greater than the level of control voltage $V_{CTL}$ sufficient to permit activating varactor $420_3$ because of the increased gate potential established by resistor 416. Including varactor $420_n$ so that it may contribute to capacitive output through capacitor 446 at output locus 402 begins at a higher control voltage $V_{CTL}$ than is required for including varactor $420_3$.

Gate $436_1$ is coupled with a supply voltage $V_{SS}$ at a supply voltage locus 409 via a resistor 450. Gate $436_2$ is coupled with supply voltage $V_{SS}$ at supply voltage locus 409 via resistors 450, 452. Gate $436_3$ is coupled with supply voltage $V_{SS}$ at supply voltage locus 409 via a resistors 450, 452, 454. Gate $436_n$ is coupled with supply voltage $V_{SS}$ at supply voltage locus 409 via resistors 450, 452, 454, 456. Gate $426_1$ is coupled with a capacitor 460. Gate $426_2$ is coupled with a capacitor 462. Gate $426_3$ is coupled with a capacitor 464. Gate $426_n$ is coupled with a capacitor 466.

A direct current (DC) current source 453 is coupled to establish a current flow through resistors 450, 452, 454, 456 and thereby establish desired voltage potentials across resistors 450, 452, 454, 456. Resistors 450, 452, 454, 456 cooperate with a current source 453 to establish increased potentials at respective gates $436_1$, $436_2$, $436_3$, $436_n$. That is, potential at gate $436_2$ is greater than potential at gate $436_1$ by the amount of potential drop across resistor 452. Potential at gate $436_3$ is greater than potential at gate $436_2$ by the amount of potential drop across resistor 454. Potential at gate $436_n$ is greater than potential at gate $436_3$ by the amount of potential drop across resistor 456. In such manner, increased gate potential is established for each of respective MOS varactors $430_1$, $430_2$, $430_3$, $430_n$. When a sufficient level of control voltage $V_{CTL}$ is applied to input locus 406 to permit activating varactor $430_1$, varactor $430_1$ becomes more capacitive so that capacitor 460 contributes to capacitive output presented at output locus 404. A level of control voltage $V_{CTL}$ sufficient to permit activating varactor $430_2$ is greater than the level of control voltage $V_{CTL}$ sufficient to permit activating varactor $430_1$ because of the increased gate potential established by resistor 452. Including a varactor $430_2$ so that it may contribute to capacitive output through capacitor 462 at output locus 404 occurs at a higher control voltage $V_{CTL}$ than is required for including varactor $430_1$. A level of control voltage $V_{CTL}$ sufficient to permit activating varactor $430_3$ is greater than the level of control voltage $V_{CTL}$ sufficient to permit activating varactor $430_2$ because of the increased gate potential established by resistor 454. Including varactor $430_3$ so that it may contribute to capacitive output through capacitor 464 at output locus 404 begins at a higher control voltage $V_{CTL}$ than is required for including varactor $430_2$. A level of control voltage $V_{CTL}$ sufficient to permit activating varactor $430_n$ is greater than the level of control voltage $V_{CTL}$ sufficient to permit activating varactor $430_3$ because of the increased gate potential established by resistor 456. Including varactor $430_n$ so that it may contribute to capacitive output through capacitor 466 at output locus 404 begins at a higher control voltage $V_{CTL}$ than is required for including varactor $430_3$.

Varactor $420_1$ may be embodied in a switching unit responsive to control voltage $V_{CTL}$ for switching between two states and contributing capacitance to output locus 402 in at least one of the two states. Varactor $220_2$ may be embodied in a switching unit responsive to control voltage $V_{CTL}$ for switching between two states and contributing capacitance to output locus 402 in at least one of the two states. Varactor $420_3$ may be embodied in a switching unit responsive to control voltage $V_{CTL}$ for switching between two states and contributing capacitance to output locus 402 in at least one of the two states. Varactor $420_n$ may be embodied in a switching unit responsive to control voltage $V_{CTL}$ for switching between two states and contributing capacitance to output locus 402 in at least one of the two states.

Varactor $430_1$ may be embodied in a switching unit responsive to control voltage $V_{CTL}$ for switching between two states and contributing capacitance to output locus 404 in at least one of the two states. Varactor $430_2$ may be embodied in a switching unit responsive to control voltage $V_{CTL}$ for switching between two states and contributing capacitance to output locus 404 in at least one of the two states. Varactor $430_3$ may be embodied in a switching unit responsive to control voltage $V_{CTL}$ for switching between two states and contributing capacitance to output locus 404 in at least one of the two states. Varactor $430_n$ may be embodied in a switching unit responsive to control voltage $V_{CTL}$ for switching between two states and contributing capacitance to output locus 404 in at least one of the two states.

Apparatus 400 is configured for differential provision of capacitance. One may use the teachings of the present invention to provide single-ended capacitance, as by using the portion of apparatus 400 enclosed within dotted line box 401.

Figure 6:
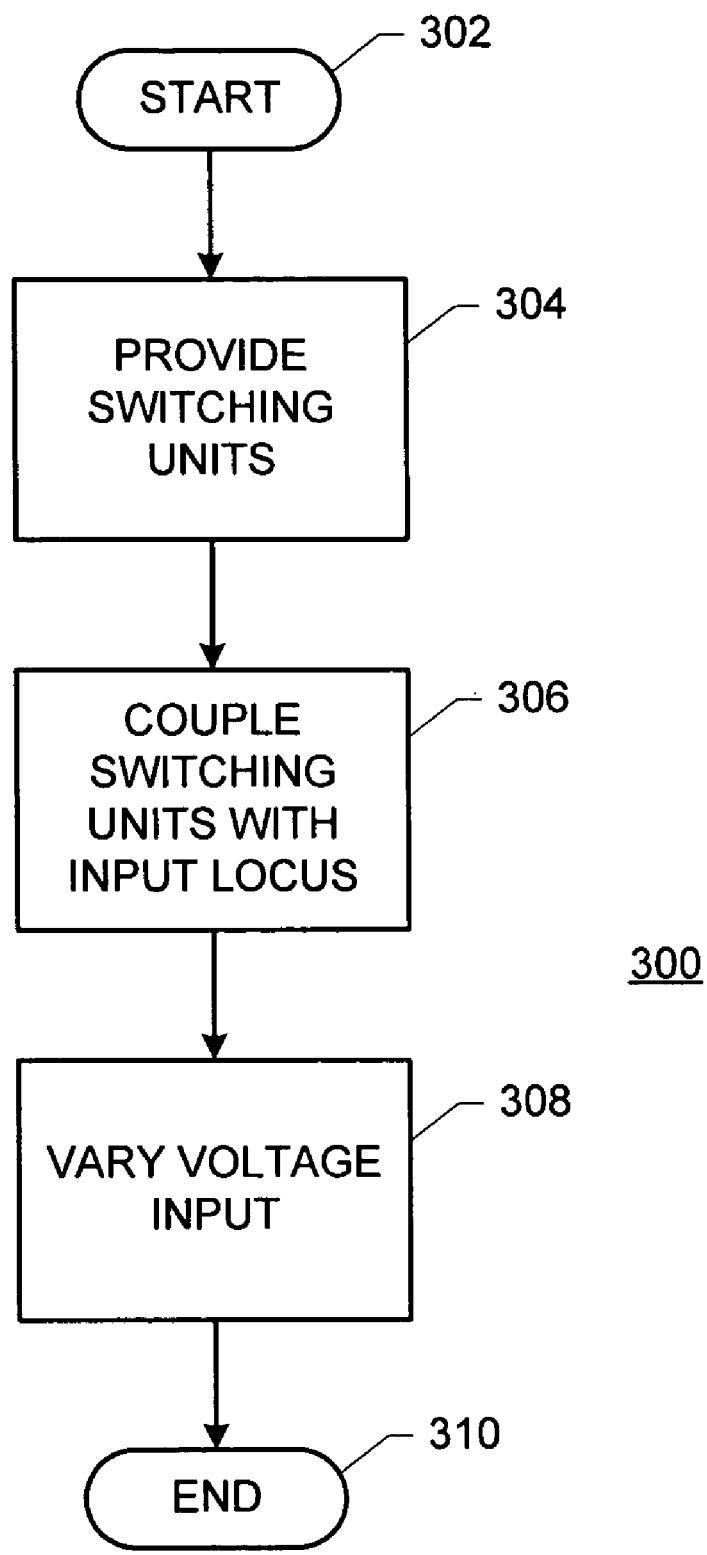
FIG. 6 is a flow chart illustrating the method of the present invention.

FIG. 6 is a flow chart illustrating the method of the present invention. In FIG. 6, a method 300 for presenting a substantially linear capacitive output at at least one output locus in response to a voltage input at an input locus begins at a START locus 302. The voltage input varies over a voltage range. Method 300 continues with the step of providing a plurality of switching units coupled with the input locus, as indicated by a block 304. Method 300 continues with the step of coupling each respective switching unit of the plurality of switching units with one output locus of the at least one output locus, as indicated by a block 306. Each respective switching unit presents a contributing capacitive output at the one output locus. Each respective contributing capacitive output exhibits a generally linear response to the voltage input over a segment of the voltage range. Method 300 continues with the step of varying the voltage input over the voltage range, as indicated by a block 308. The plurality of switching units cooperates to establish the substantially linear capacitive output over substantially all of the voltage range. Method 300 terminates at an END locus 310.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. An apparatus for presenting a capacitive output at at least one output locus in response to receiving a voltage input at an input locus; said voltage input varying over a voltage range; the apparatus comprising:
   (a) a plurality of switching units coupled with said input locus; and
   (b) a plurality of capacitive units coupled with selected switch units of said plurality of switch units and with a respective output locus of said at least one output locus; each respective switch unit of said plurality of switch units being configured to conduct in response to said voltage input over a respective range-portion of said voltage range; said capacitive output being substantially linearly variable with respect to said voltage input over a segment of said voltage range spanning a plurality of said range-portions,
   wherein said plurality of switching units is a plurality of MOS transistor; each respective MOS transistor having a respective gate coupled with said input locus, and
   wherein each respective MOS transistor has a respective source and a respective drain; each respective capacitive unit of said plurality of capacitive units being coupled between a respective said drain and a respective output locus of said at least one output locus.

2. An apparatus for presenting a capacitive output at an output locus in response to receiving a voltage input at an input locus as recited in claim 1 wherein said plurality of capacitive units is a plurality of MOS capacitors.

3. An apparatus for presenting a capacitive output at an output locus in response to receiving a voltage input at an input locus as recited in claim 1 wherein said plurality of capacitive units is a plurality of MOS capacitors.

4. An apparatus for presenting a capacitive output at an output locus in response to receiving a voltage input at an input locus as recited in claim 1 wherein said plurality of capacitive units is a plurality of MOS capacitors.

5. An apparatus for presenting a capacitive output at an output locus in response to receiving a voltage input at an input locus as recited in claim 1 wherein each said respective source is coupled with a supply voltage via a respective resistance unit having a respective resistance value; each said respective resistance value contributing to defining a respective said range-portion.

6. An apparatus for presenting a capacitive output at an output locus in response to receiving a voltage input at an input locus as recited in claim 5 wherein said plurality of capacitive units is a plurality of MOS capacitors.

7. An apparatus for presenting a capacitive output at an output locus in response to receiving a voltage input at an input locus as recited in claim 5 wherein said plurality of MOS transistors is an even number n of MOS transistors; a first set of $$\frac{n}{2}$$

said MOS transistors being coupled via a respective said capacitive unit with a first output locus of said at least one output locus; a second set of $$\frac{n}{2}$$

said MOS transistors being coupled via a respective said capacitive unit with a second output locus of said at least one output locus.

8. An apparatus for presenting a capacitive output at an output locus in response to receiving a voltage input at an input locus as recited in claim 7 wherein said plurality of capacitive units is a plurality of MOS capacitors.

9. An apparatus for presenting a substantially linear capacitive output at least one output locus in response to a voltage input at an input locus; said voltage input varying over a voltage range; the apparatus comprising: a plurality of switching units coupled with said input locus; each respective switching unit of said plurality of switching units being coupled with one output locus of said at least one output locus; each said respective switching unit presenting a contributing capacitive output at said one output locus; said contributing capacitive output exhibiting a generally linear response to said voltage input over a segment of said voltage range; all said respective switching units cooperating to establish said substantially linear capacitive output over substantially all of said voltage range, wherein said plurality of switching units is a plurality of MOS transistors and an associated capacitive unit; each respective MOS transistor having a respective gate coupled with said input locus; each respective MOS transistor having a respective source and a respective drain; said associated capacitive unit of each said respective MOS transistor being coupled between a respective said drain and a respective output locus of said at least one output locus.

10. An apparatus for presenting a substantially linear capacitive output at least one output locus in response to a voltage input at an input locus as recited in claim 9 wherein said plurality of switching units is a plurality of MOS transistors; each respective MOS transistor having a respective gate coupled with said input locus.

11. An apparatus for presenting a substantially linear capacitive output at at least one output locus in response to a voltage input at an input locus as recited in claim 9 wherein said associated capacitive unit is a MOS capacitor.

12. An apparatus for presenting a substantially linear capacitive output at at least one output locus in response to a voltage input at an input locus as recited in claim 9 wherein each said respective source is coupled with a supply voltage via a respective resistance unit having a respective resistance value; each said respective resistance value contributing to defining a respective said segment.

13. An apparatus for presenting a substantially linear capacitive output at least one output locus in response to a voltage input at an input locus as recited in claim 11 wherein each said respective source is coupled with a supply voltage via a respective resistance unit having a respective resistance value; each said respective resistance value contributing to defining a respective said segment.

14. An apparatus for presenting a substantially linear capacitive output at at least one output locus in response to a voltage input at an input locus as recited in claim 12 wherein said plurality of MOS transistors is an even number n of MOS transistors; a first set of $$\frac{n}{2}$$

said MOS transistors being coupled via a respective said associated capacitive unit with a first output locus of said at least one output locus; a second set of $$\frac{n}{2}$$

said MOS transistors being coupled via a respective said associated capacitive unit with a second output locus of said at least one output locus.

15. A method for presenting a substantially linear capacitive output at least one output locus in response to a voltage input at an input locus; said voltage input varying over a voltage range; the method comprising the steps of:

(a) providing a plurality of switching units coupled with said input locus (b) coupling each respective switching unit of said plurality of switching units with one output locus of said at least one output locus; each said respective switching unit presenting a contributing capacitive output at said one output locus; each respective said contributing capacitive output exhibiting a generally linear response to said voltage input over a segment of said voltage range; and (c) varying said voltage input over said voltage range so that said plurality of switching units cooperates to establish said substantially linear capacitive output over substantially all of said voltage range, wherein said plurality of switching units is a plurality of MOS transistors and an associated capacitive unit; each respective MOS transistor having a respective gate coupled with said input locus; each respective MOS transistor having a respective source and a respective drain; said associated capacitive unit of each said respective MOS transistor being coupled between a respective said drain and a respective output locus of said at least one output locus.

16. A method for presenting a substantially linear capacitive output at least one output locus in response to a voltage input at an input locus as recited in claim 15 wherein each said respective source is coupled with a supply voltage via a respective resistance unit having a respective resistance value; each said respective resistance value contributing to defining a respective said segment.

* * * * *